United States Patent
Rao

(10) Patent No.: US 12,140,643 B2
(45) Date of Patent: Nov. 12, 2024

(54) SYSTEM FOR DETECTING AN ELECTRICAL GROUNDING INTERGRID INTEGRITY

(71) Applicant: JEF TECHNO SOLUTIONS PVT LTD, Bangalore (IN)

(72) Inventor: Prashanth Belur Gururaja Rao, Bangalore (IN)

(73) Assignee: JEF TECHNO SOLUTIONS PVT LTD, Bangalore (IN)

( * ) Notice: Subject to any disclaimer, the term of this patent is extended or adjusted under 35 U.S.C. 154(b) by 0 days.

(21) Appl. No.: 18/022,970

(22) PCT Filed: Dec. 31, 2021

(86) PCT No.: PCT/IN2021/051221
§ 371 (c)(1),
(2) Date: Feb. 23, 2023

(87) PCT Pub. No.: WO2022/157800
PCT Pub. Date: Jul. 28, 2022

(65) Prior Publication Data
US 2024/0012068 A1  Jan. 11, 2024

(30) Foreign Application Priority Data
Jan. 19, 2021 (IN) .............. 202141002489

(51) Int. Cl.
*G01R 31/52* (2020.01)
*G01R 31/08* (2020.01)
*G01R 19/10* (2006.01)

(52) U.S. Cl.
CPC .......... *G01R 31/52* (2020.01); *G01R 31/086* (2013.01); *G01R 19/10* (2013.01)

(58) Field of Classification Search
CPC ...... G01R 31/52; G01R 31/086; G01R 19/10; G01R 31/083; G01R 31/54; H01R 4/66
See application file for complete search history.

(56) References Cited

U.S. PATENT DOCUMENTS

| 2013/0191059 A1* | 7/2013 | Legros ............... G01R 27/20 702/65 |
| 2014/0153144 A1* | 6/2014 | Lacey ................. H02H 3/33 361/45 |

\* cited by examiner

*Primary Examiner* — Giovanni Astacio-Oquendo
*Assistant Examiner* — Zannatul Ferdous

(57) ABSTRACT

A system for detecting an electrical grounding inter grid integrity between the earth grids includes a current injection device 108 that provides the low amplitude input current with off-grid frequency to the first earth grid 102 to detect the electrical grounding inter grid integrity between the first earth grid 102 and the second earth grid 104. The system includes a measuring device 106 that is connected to a first reference riser 112A and a second reference riser 112B to measure a drop in voltage or resistance between the first earth grid 102 and the second earth grid 104. The system includes a first bypass conductor 114 that is connected between the first earth grid 102 and the second earth grid 104 to transmit the input current with off-grid frequency to the second earth grid 104 when the electrical grounding inter grid connectivity is damaged.

10 Claims, 5 Drawing Sheets

SYSTEM FOR DETECTING AN ELECTRICAL GROUNDING INTERGRID INTEGRITY

BACKGROUND

Technical Field

The embodiments herein generally relate to detection of an electrical grounding inter-grid integrity, and more particularly, to a system and method for detecting the inter-grid integrity between earth grids using a current injection device and a measuring device.

Description of the Related Art

In an electrical system, the earth grid connection from at least one of electric substations or process plants or power plants is permanently buried under the ground and it is not easily accessible. Sometimes, the accident may happen when people walk over a buried earth grid which has breakage or damage in connection to a neighbouring ground grid and damage may result to equipment connected to such a damaged grounding system.

Existing system detects the breakage/damage in the grid connection by measuring a ground to earth neutral fault in live alternating current circuits by comparing voltage drops across portions of the circuit. The ratio of voltage drops of circuit portions that are measured indicates the fault in the circuit. Another existing system detects a damage in the earth grid by injecting a high current at relatively higher voltage to the earth grid. Sometimes, the injection of the high current may cause tripping of the electrical system and may cause damage to the equipment that is connected to the earth grid. Further, the high current may be provided to the electrical grid only when the earth grid is not in service. Thus, the testing of the earth grid may take few weeks or few days to complete the test. Further, the electric substations or process plants or power plants also needs to shut down when the testing is carried out in order to determine a fault in the earth grid.

As mentioned, there remains a need for a system to determine an electrical grounding inter grid integrity between earth grids buried under the earth when the substation is in service without injecting the high current and does not cause threat to safety of the equipment and personnel.

SUMMARY

In view of the foregoing, an embodiment herein provides a system for detecting an electrical grounding inter-grid integrity. The system includes (i) a current injection device, (ii) an inter-grid, and (iii) a first bypass conductor. The current injection device includes (i) a frequency converter that modifies an input current with grid frequency into an input current with off-grid frequency and (ii) a current unit that regulates the input current with off-grid frequency into a variable amplitude input current with off-grid frequency. The electrical grounding inter-grid includes a plurality of earth grids, wherein the plurality of earth grids includes (i) a first earth grid, (ii) a second earth grid (iii) a third earth grid and (iv) an inter grid connectivity. The first earth grid includes a first reference riser that is connected to the current injection device and the first earth grid. In some embodiments, the second earth grid includes a second reference riser that is connected to the second earth grid and the current injection device. The first reference riser receives the input current with off-grid frequency from the current injection device and provides the input current with off-grid frequency to the first earth grid. The second earth grid is electrically connected to the first earth grid through a first inter-grid connectivity to receive the input current with off-grid frequency from the first earth grid. The second earth grid transmits the input current with off-grid frequency to the current injection device using a second reference riser. The first bypass conductor connects the first earth grid and the second earth grid to transmit the received input current with off-grid frequency from the first earth grid to the second earth grid to determine the integrity of the first inter-grid connectivity. The system includes a measuring device that is connected between the first reference riser and the second reference riser to measure a voltage drop and resistance. The third earth grid is electrically connected to (i) the first earth grid through a second inter-grid connectivity and (ii) the second earth grid through a third inter-grid connectivity. The third earth grid is electrically connected to the first earth grid and the second earth grid to transmit the input current received in the first earth grid to the second earth grid when the first earth grid and the second earth grid is not connected through the first inter-grid connectivity. The third earth grid is electrically connected to (i) the first earth grid through a second inter-grid connectivity and (ii) the second earth grid through a third inter-grid connectivity. The third earth grid is electrically connected to the first earth grid and the second earth grid to transmit the input current received in the first earth grid to the second earth grid when the first earth grid and the second earth grid is not connected through the first inter-grid connectivity.

In some embodiments, the system includes a second bypass conductor that connects the first earth grid and the third earth grid. The measuring device connected between the first earth grid and the third earth grid to detect a fault in the second inter grid connectivity between the first earth grid and the third earth grid when a drop in voltage or resistance measured before connecting the second bypass conductor between the first earth grid and the third earth grid is greater than a drop in voltage or resistance measured after connecting the second bypass conductor between the first earth grid and the third earth grid.

In some embodiments. the system includes a third bypass conductor that connects the second earth grid and the third earth grid. The measuring device connected between the third earth grid and the second earth grid to detect a fault in the third inter grid connectivity between the third earth grid and the second earth grid when a drop in voltage or resistance measured before connecting the third bypass conductor between the third earth grid and the second earth grid is greater than a drop in voltage or resistance measured after connecting the third bypass conductor between the third earth grid and the second earth grid.

In some embodiments, the measuring device connected between the first earth grid and the second earth grid to detect a fault in the first inter grid connectivity between the first earth grid and the second earth grid when a drop in voltage or resistance measured before connecting the second bypass conductor is greater than a drop in voltage or resistance measured after connecting the second bypass conductor between the first earth grid and the third earth grid.

In some embodiments, the fault includes at least one of (i) full breakage in at least one of the first earth grid or the second earth grid or the third earth grid or (ii) a loose connection in at least one of the first earth grid or the second earth rid or the third earth grid or (iii) good connection in at least one of the first earth grid or the second earth rid or the third earth grid.

In an aspect, a method for detecting an electrical grounding inter-grid integrity. The method includes (i) modifying, using a frequency converter, an input current with grid frequency into an input current with off-grid frequency, (ii) regulating, using a current unit, the input current with off-grid frequency into a variable amplitude input current with off-grid frequency, (iii) receiving, using a first reference riser, the input current with off-grid frequency from a current injection device and providing the input current with off-grid frequency to a first earth grid, (iv) receiving, using a first inter grid connectivity, the input current with off-grid frequency from the first earth grid, (v) connecting, using a first bypass conductor, the first earth grid and the second earth grid to transmit the received input current with off-grid frequency from the first earth grid to the second earth grid to determine an integrity of the first inter-grid connectivity, (vi) measuring, using a measuring device (106), a voltage drop and resistance between the first reference riser and the second reference riser. The second reference riser is connected to a second earth grid and with the current injection device. The second earth grid that is electrically connected to the first earth grid through a first inter-grid connectivity to receive the input current with off-grid frequency from the first earth grid. The second earth grid transmits the input current with off-grid frequency to the current injection device using a second reference riser. The third earth grid is electrically connected to the first earth grid and the second earth grid. The third earth grid that is electrically connected to (i) the first earth grid through a second inter-grid connectivity and (ii) the second earth grid through a third inter-grid connectivity.

In some embodiments, the method includes measuring, using the measuring device, a drop in voltage or resistance between the first earth grid and the second earth grid (a) before connecting the first bypass conductor between the first earth grid and the second earth grid and (b) after connecting the first bypass conductor between the first earth grid and the second earth grid.

In some embodiments, the method includes detecting, using the measuring device, a fault in the first inter grid connectivity between the first earth grid and the second earth grid when a drop in voltage or resistance measured before connecting the first bypass conductor between the first earth grid and the second earth grid is greater than a drop in voltage or resistance measured after connecting the first bypass conductor between the first earth grid and the second earth grid. The measuring device is connected between the first earth grid and the third earth grid.

In some embodiments, the method includes detecting, using the measuring device, a fault in the second inter grid connectivity between the first earth grid and the third earth grid when a drop in voltage or resistance measured before connecting a second bypass conductor between the first earth grid and the third earth grid is greater than a drop in voltage or resistance measured after connecting the second bypass conductor between the first earth grid and the third earth grid. The second bypass conductor connects the first earth grid and the third earth grid. The measuring device is connected between the third earth grid and the second earth grid.

In some embodiments, the method includes detecting, using the measuring device, a fault in the third inter grid connectivity between the third earth grid and the second earth grid when a drop in voltage or resistance measured before connecting a third bypass conductor between the third earth grid and the second earth grid is greater than a drop in voltage or resistance measured after connecting the third bypass conductor between the third earth grid and the second earth grid. The third bypass conductor connects the second earth grid and the third earth grid. The measuring device is connected between the first earth grid and the second earth grid.

The system detects the electrical grounding inter-grid integrity between the earth grids more accurately. The system may detect the electrical grounding inter-grid integrity when the inter grid is in service. The system provides low input current to the earth grids, thereby avoiding an accident while detecting the electrical grounding inter-grid integrity. The low current with off-grid frequency provided to the inter grid for detecting the inter-grid integrity does not disturb the high current in the inter-grid with grid frequency. When the faulty connection is detected in the inter-grid, an area of the faulty connection below ground is excavated and the connection in the excavated area is repaired.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
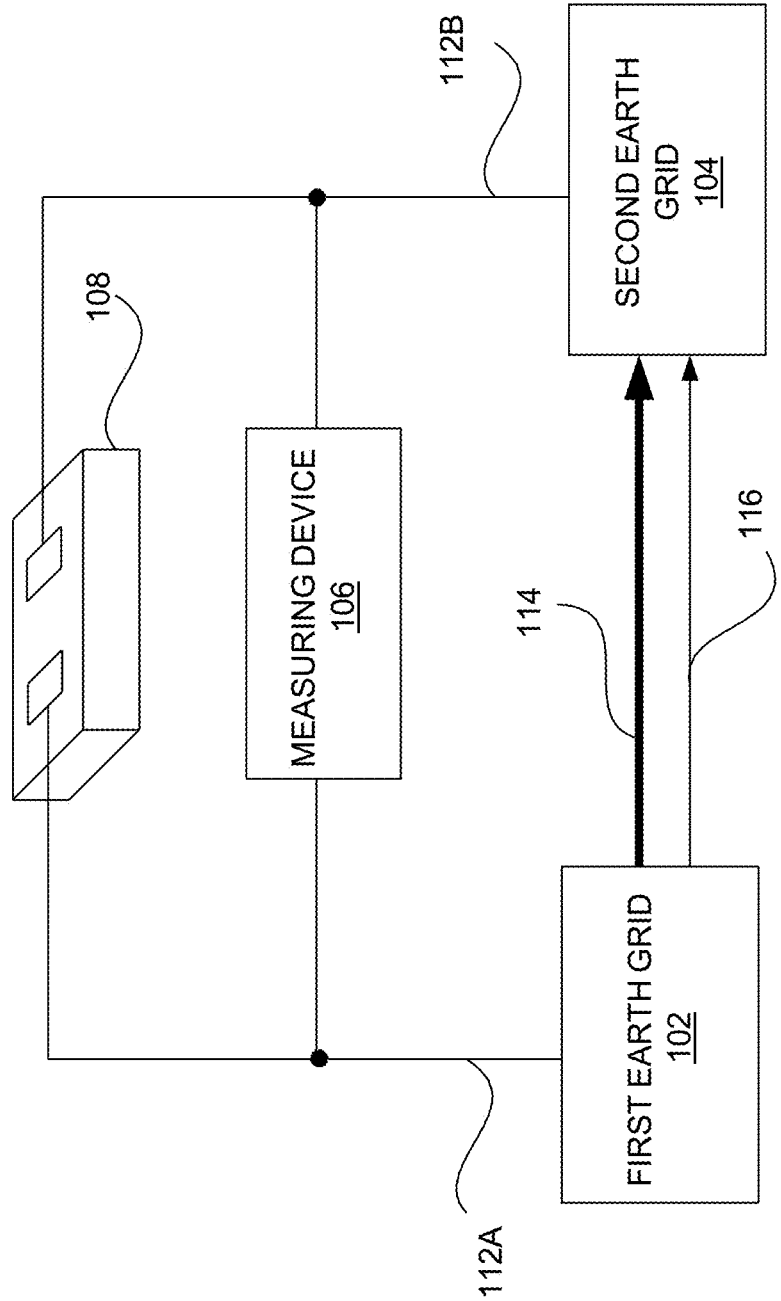
FIG. 1 is an exploded view of a system for detecting an electrical grounding inter grid integrity between a first earth grid and a second earth grid using a current injection device and a measuring device according to some embodiments herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a system to detect an electrical grounding inter-grid integrity between the earth grids buried under the ground. The system includes a current injection device that provides a low input current to the earth grids to detect the inter-grid integrity between the earth grids when the earth grid is in service. Referring now to the drawings, and more particularly to FIGS. 1 to 4B, where similar reference characters denote corresponding features consistently throughout the figures, preferred embodiments are shown.

FIG. 1 is an exploded view for a system for detecting an electrical grounding inter-grid integrity between a first earth grid 102 and a second earth grid 104 using a current injection device 108 and a measuring device 106 according to some embodiments herein. The system includes a plurality of earth grids, the current injection device 108, and the measuring device 106. The current injection device 108 is connected to a plurality of earth grids. The plurality of earth grids includes the first earth grid 102 and the second earth grid 104. In some embodiments, the current may be a grid fault current. In some embodiments, the grid fault current from the electrical substations flows to the plurality of earth grids through an inter grid connectivity. In some embodiments, the inter grid connectivity is buried under the earth to dissipate fault currents. The plurality of earth grids optionally includes a third earth grid. In some embodiments, the plurality of earth grids includes n number of earth grids may connected with each other.

The first earth grid 102 is electrically connected to the second earth grid 104 using a first inter-grid connectivity 116. The first earth grid 102 is connected to the electrical substation to receive the grid fault current. In some embodiments, the grid current may be a grid fault current. In some embodiments, the second earth grid 104 receives the grid current from the electrical substations through first earth grid 102. In some embodiments, the second earth grid 104 that is connected to the electrical substation to receive grid fault current. The system detects the inter grid integrity in the first inter grid connectivity 116 between the first earth grid 102 and the second earth grid 104 buried under the earth. The system detects the inter grid integrity in the first inter grid connectivity using the current injection device 108 and the measuring device 106. In some embodiments, the inter grid connectivity is made of at least one of copper or aluminium or galvanised iron or mild steel. The system detects the inter grid integrity in the inter grid connectivity that is connected to the plurality of earth grids without disturbing or removing the plurality of earth grids from service.

The current injection device 108 is connected to the first earth grid 102 and the second earth grid 104 to provide a low amplitude input current with off-grid frequency to detect the inter grid integrity in the first inter grid connectivity 116, which is buried under the earth without excavating. The first earth grid 102 includes a first reference riser 112A and the second earth grid 104 includes a second reference riser 112B. In some embodiments, the reference riser (e.g. the first reference riser 112A and the second reference riser 112B) is a node taken from the plurality of earth grid to provide the input current with off-grid frequency to the plurality of earth grids.

The current injection device 108 provides the low amplitude input current with off-grid frequency to the first earth grid 102 using the first reference riser 112A and the second earth grid 104 using the second reference riser 112B. In some embodiments, the current injection device 108 receives a power supply from the electrical substations. The current injection device 108 modifies the input current with a grid frequency received from the electrical substation into the input current with off-grid frequency. The current injection device 108 regulates the input current with off-grid frequency into a variable amplitude input current with off-grid frequency. In some embodiments, the system includes a voltage regulator that is used to monitor the flow of the input current with off-grid frequency and to regulate the voltage. In some embodiments, the voltage regulator includes a capacitor to regulate the voltage. The current injection device 108 provides the low amplitude input current with off-grid frequency to the first earth grid 102 through the first reference riser 112A and the second earth grid 104 through the second reference riser 112B. In some embodiments, the first reference riser 112A is a connection between the current injection device 108 and the first earth grid 102. In some embodiments, the second reference riser 112B is a connection between the current injection device 108 and the second earth grid 104. In some embodiments, the low voltage input current injected to the earth grid ranges from 1 ampere to 20 amperes.

The measuring device 106 is connected to the first reference riser 112A and to the second reference riser 112B. The measuring device 106 is connected to the first earth grid 102 and the second earth grid 104 to measure a drop in voltage or resistance. In some embodiments, the measuring device 106 is connected to the first reference riser 112A and to the second reference riser 112B. The first earth grid 102 and the second earth grid 104 are connected through a first bypass conductor 114 which transmits the received input current with off-grid frequency from the first earth grid 102 to the second earth grid 104 when the first inter grid connectivity 116 is damaged. The measuring device 106 measures a drop in voltage or resistance between the first earth grid 102 and the second earth grid 104 to detect the inter grid integrity. The measuring device 106 measures a drop in voltage or resistance between the first earth grid 102 and the second earth grid 104 before connecting the first bypass conductor 114 between the first earth grid 102 and the second earth grid 104 and after connecting the first bypass conductor 114 between the first earth grid 102 and the second earth grid 104. The measuring device 106 detects a fault in the first inter grid connectivity 116 between the first earth grid 102 and the second earth grid 104 when the drop in voltage or resistance measured before connecting the first bypass conductor 114 between the first earth grid 102 and the second earth grid 104 is greater than the drop in voltage or resistance measured after connecting the first bypass conductor 114 between the first earth grid 102 and the second earth grid 104.

The faulty connection includes at least one of (i) an inter grid connectivity that is weekly connected between the first earth grid 102 and the second earth grid 104, and (ii) an inter grid connectivity that is open towards the first earth grid 102 and the second earth grid 104.

Figure 2:
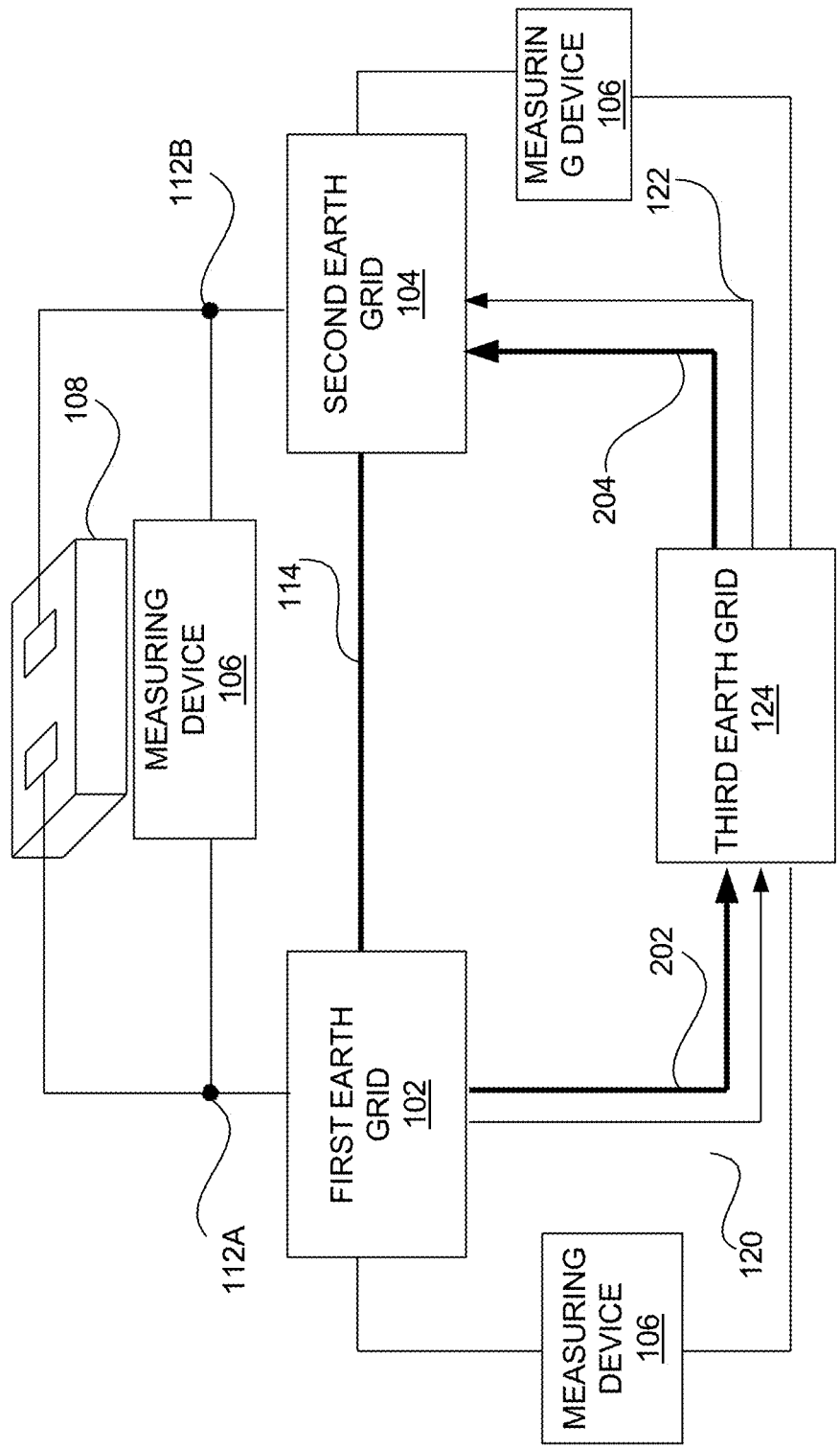
FIG. 2 is an exploded view of the system of FIG. 1 for detecting the electrical grounding inter-grid integrity between the first earth grid and the second earth grid that is connected serially/parallelly through a third earth grid according to some embodiments herein.

FIG. 2 is an exploded view of the system of FIG. 1 for detecting the electrical grounding inter-grid integrity between the first earth grid 102 and the second earth grid 104 that is connected serially/parallelly through a third earth grid 124 according to some embodiments herein. The first earth grid 102 and the second earth grid 104 are electrically connected through the third earth grid 124. In some embodiments, the third earth grid 124 receives the faulty grid current from the electrical substations through the first earth grid 102 and a second inter grid connectivity 120. The first earth grid 102 transmits the input current with off-grid frequency to the second earth grid 104 through the third earth grid 124. The first earth grid 102 transmits the input current with off-grid frequency to the third earth grid 124 using the second inter grid connectivity 120. The third earth grid 124 transmits the input current with off-grid frequency to the second earth grid 104 through a third inter grid connectivity 122. The first earth grid 102 is connected to the third earth grid 124 using the second inter grid connectivity 120. The system comprises the first bypass conductor 114 that is connected between the first earth grid 102 and the second earth grid 104 to transmit the received input current with off-grid frequency from the first earth grid 102 to the second earth grid 104 to determine a presence and integrity of the first inter-grid connectivity 116. The measuring device 106 measures a drop in voltage or resistance between the first earth grid 102 and the second earth grid 104 before connecting the first bypass conductor 114 between the first earth grid 102 and the second earth grid 104 and after connecting the first bypass conductor 114 between the first earth grid 102 and the second earth grid 104. The measuring device 106 detects a fault in the first inter grid connectivity 116 between the first earth grid 102 and the second earth grid 104 when the drop in voltage or resistance measured before connecting the first bypass conductor 114 between the first earth grid 102 and the second earth grid 104 is greater than the drop in voltage or resistance measured after connecting the first bypass conductor 114 between the first earth grid 102 and the second earth grid 104. The system comprises a second bypass conductor 202 that is connected between the first earth grid 102 and the third earth grid 124. In some embodiments, the second bypass conductor 202 that connects the first earth grid 102 and the third earth grid 124 to transmit the received input current with off-grid frequency from the first earth grid 102 to the third earth grid 124 to determine a presence of the second inter-grid connectivity 120. In some embodiments, when the second inter grid integrity 120 is damaged, the potential difference is high before connecting the second bypass conductor 202 and potential difference is low after connecting the second bypass conductor 202. The measuring device 106 measures a drop in voltage or resistance between the first earth grid 102 and the third earth grid 124 before connecting the second bypass conductor 202 between the first earth grid 102 and the third earth grid 124 and after connecting the second bypass conductor 202 between the first earth grid 102 and the third earth grid 124 to detect a fault in the second inter grid connectivity 120 between the first earth grid 102 and the third earth grid 124 when the drop in voltage or resistance measured before connecting the second bypass conductor 202 between the first earth grid 102 and the third earth grid 124 is greater than the drop in voltage or resistance measured after connecting the second bypass conductor 202 between the first earth grid 102 and the third earth grid 124.

In some embodiments, the system includes a third bypass conductor 204 that is connected between the second earth grid 104 and the third earth grid 124. In some embodiments, the third bypass conductor 204 that connects the second earth grid 104 and the third earth grid 124 to transmit the received input current with off-grid frequency from the third earth grid 124 to the second earth grid 104 to determine the third inter-grid connectivity 122 is damaged or not. In some embodiments, when the third inter grid integrity 122 is damaged, the potential difference is high before connecting the third bypass conductor 204 and potential difference is low after connecting the third bypass conductor 204. The measuring device 106 measures a drop in voltage or resistance between the third earth grid 124 and the second earth grid 104 before connecting the third bypass conductor 204 between the third earth grid 124 and the second earth grid 104 and after connecting the third bypass conductor 204 between the third earth grid 124 and the second earth grid 104 to detect a fault in the third inter grid connectivity 122 between the third earth grid 124 and the second earth grid 104 when the drop in voltage or resistance measured before connecting the third bypass conductor 204 between the third earth grid 124 and the second earth grid 104 is greater than the drop in voltage or resistance measured after connecting the third bypass conductor 204 between the third earth grid 124 and the second earth grid 104. In some embodiments, the potential difference measured by the measuring device 106 is low when the third inter grid integrity 122 is damaged. In some embodiments, the first bypass conductor 114 is connected between the first earth grid 102 and the second earth grid 104 to determine the direct connection between the first earth grid 102 and the second earth grid 104. In some embodiments, the measuring device 106 is connected between at least one of the first earth grid 102 and the second earth grid 104 when the first bypass conductor 114 is connected between the first earth grid 102 and the second earth grid 104 to check integrity of first inter grid connectivity 116 or the first earth grid 102 and the third earth grid 124 when the second bypass conductor 202 is connected between the first earth grid 102 and the third earth grid 124 to check integrity of the second inter grid connectivity 120 or the third earth grid 124 and the second earth grid 104 when the third bypass conductor 204 is connected between the third earth grid 124 and the second earth grid 104 to check integrity of the third inter grid connectivity 122 to measures a drop in voltage or resistance.

Figure 3:
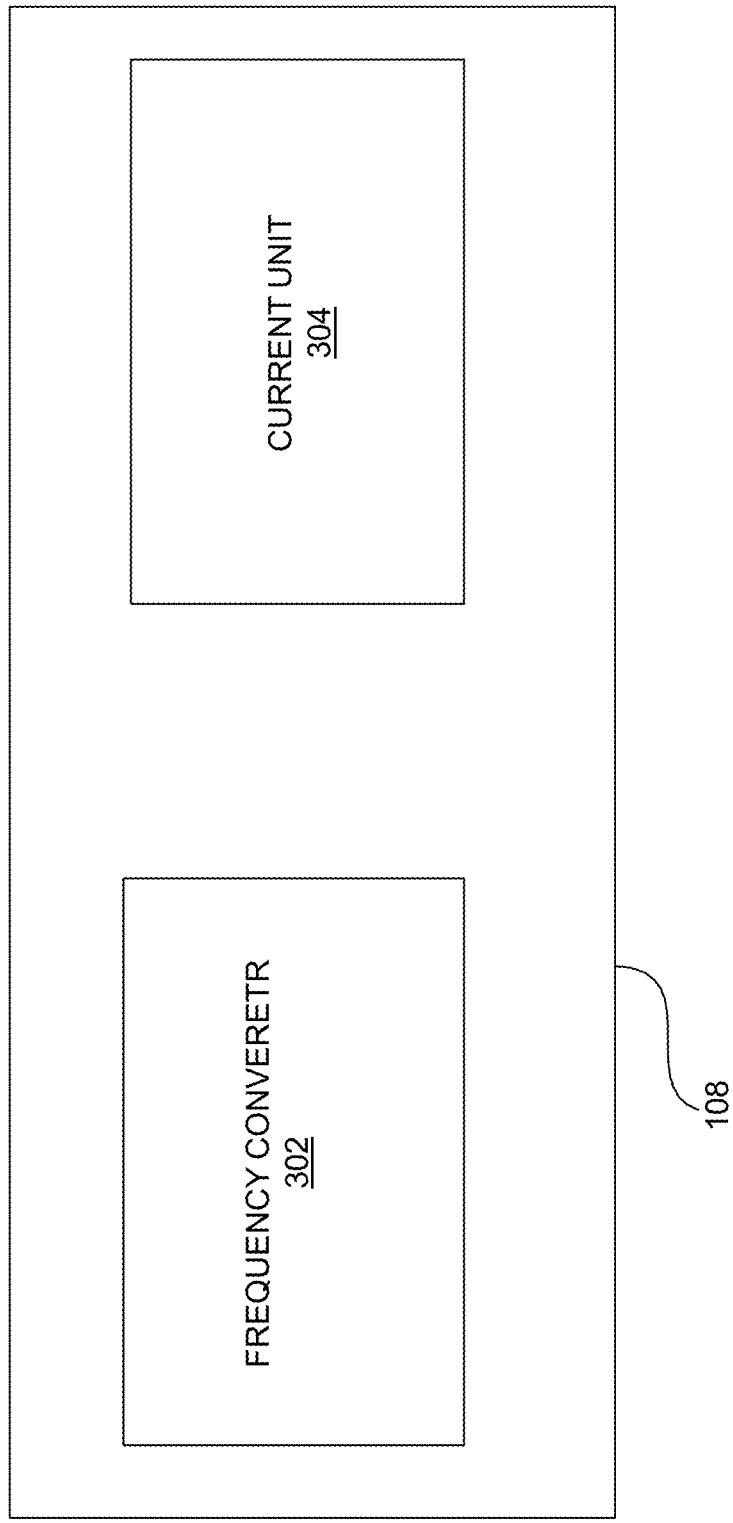
FIG. 3 is block diagram of the current injection device that provides the low input current to the earth grid to detect the electrical grounding inter-grid integrity between the earth grids of FIG. 1 according to some embodiments herein.

FIG. 3 is block diagram of the current injection device 108 that provides the low input current to the earth grid to detect the electrical grounding inter grid integrity between the earth grid of FIG. 1 according to some embodiments herein. The current injection device 108 includes a frequency converter 302 and a current unit 304. The frequency converter 302 receives the input current from the electrical grid. In some embodiments, the current received from the electrical grid is in grid frequency. The frequency converter 302 modifies the input current with grid frequency into the input current with off-grid frequency. In some embodiments, the grid frequency is modified into off-grid frequency to provide the input current with off-grid frequency into the plurality of earth grid. The output from the frequency converter 302 is provided to the current unit 304. The current unit 304 regulates the input current with off-grid frequency into the variable amplitude input current with off-grid frequency. In some embodiments, the input current may be varied between a range of 1 ampere to 20 amperes. In some embodiments, the input current and frequency are regulated based on the earth grid current and frequency. In some embodiments, the regulated input current is provided to the plurality of earth grid using the one or more reference riser 112A-B (e.g. the first reference riser 112A and the second reference riser 112B).

Figure 4A:
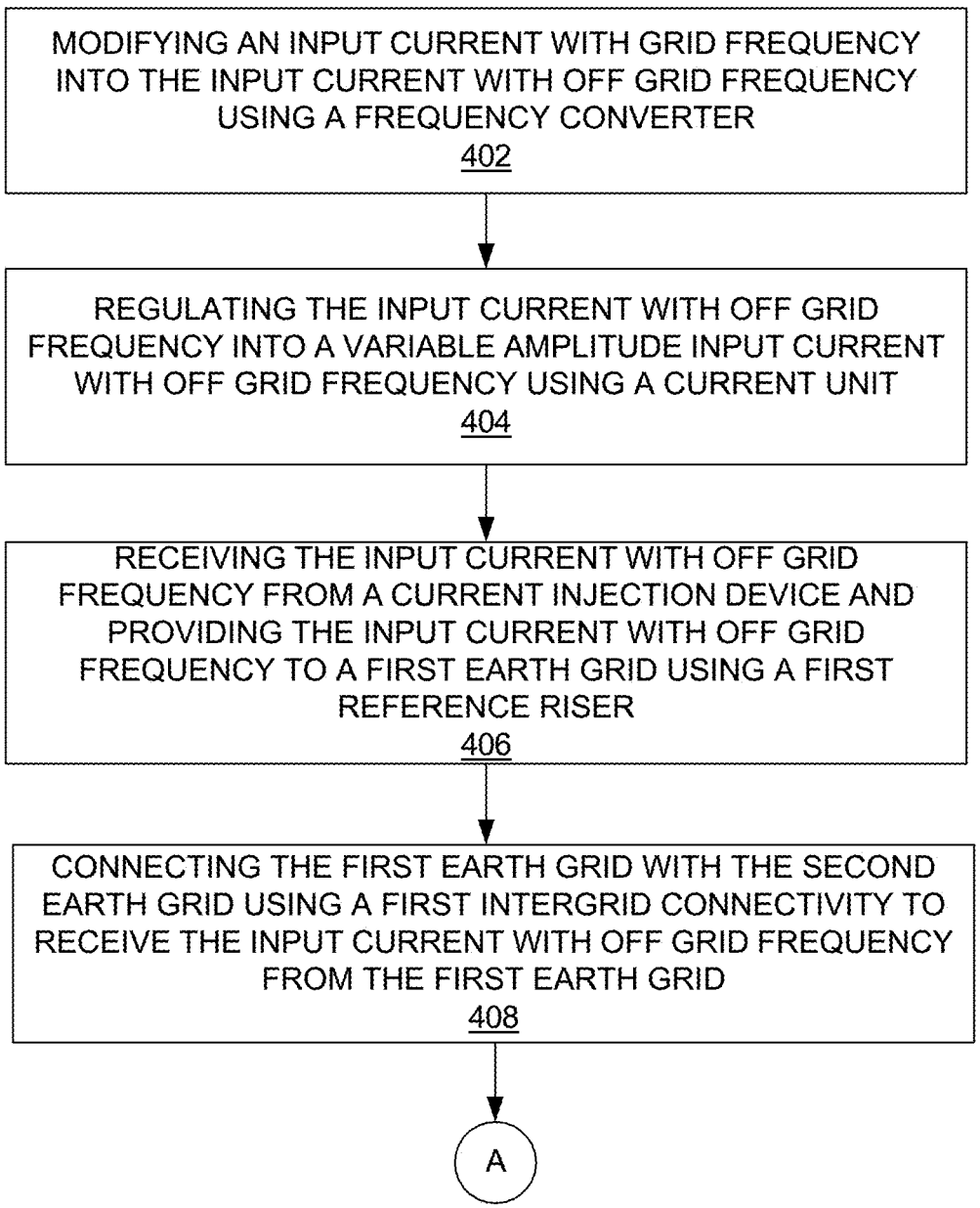
FIGS. 4A-4B are flow diagrams that illustrate a method for detecting an electrical grounding inter-grid integrity between a first earth grid and a second earth grid using a current injection device and a measuring device of FIG. 1 according to some embodiments herein.
Figure 4B:
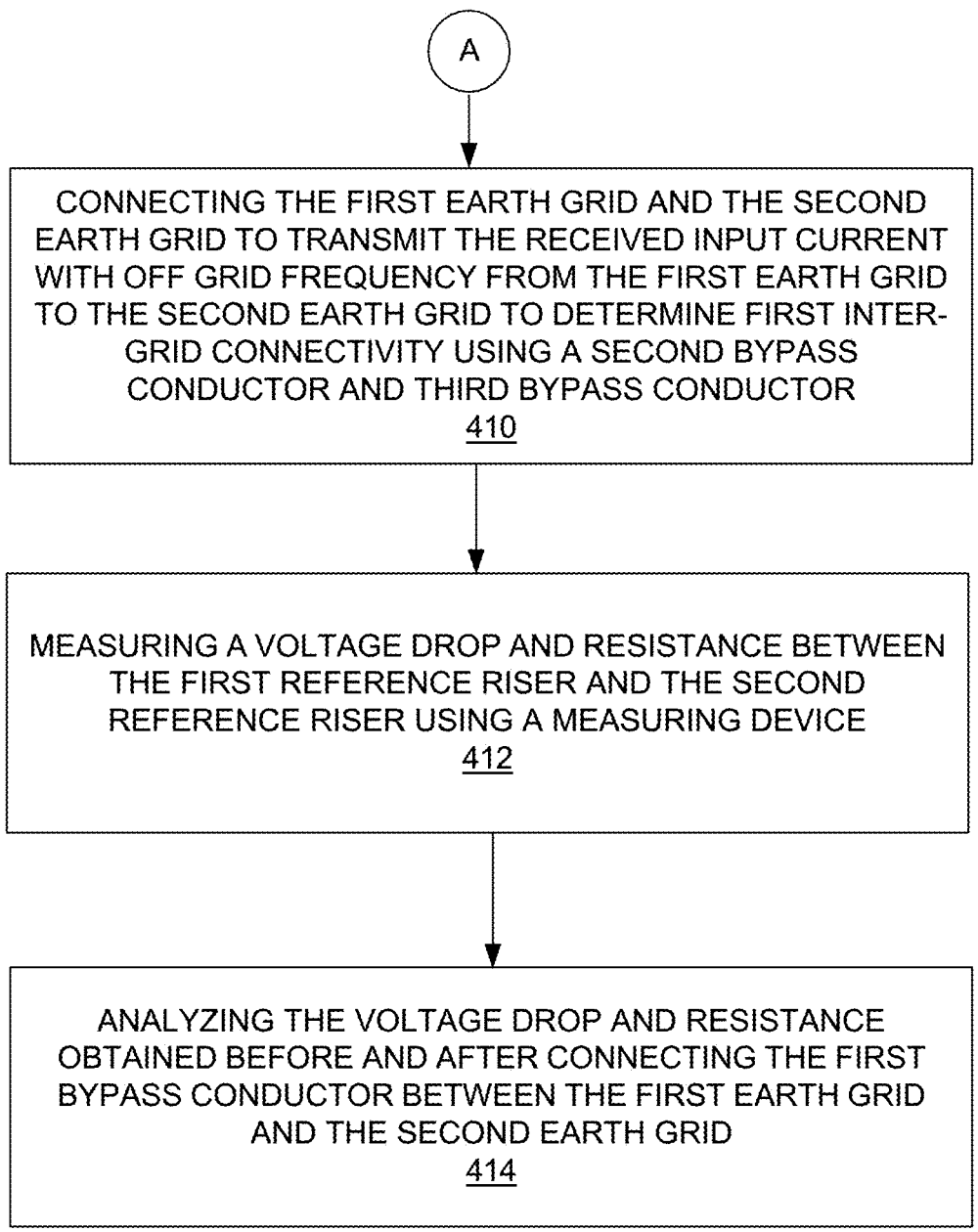

FIGS. 4A-4B are flow diagrams that illustrate a method for detecting an electrical grounding inter-grid integrity between the first earth grid 102 and the second earth grid 104 using the current injection device 108 and the measuring device 106 of FIG. 1 according to some embodiments herein. At step 402, an input current with grid frequency is modified into the input current with off-grid frequency using the frequency converter 302. At step 404, the input current with off-grid frequency is regulated into a variable amplitude input current with off-grid frequency using the current unit 304. At step 406, the input current with off-grid frequency from the current injection device 108 is received and the input current with off-grid frequency is provided to the first earth grid 102 using a first reference riser 112A. At step 408, the first earth grid 102 with the second earth grid 104 is connected using the first inter grid connectivity 116 to receive the input current with off-grid frequency from the first earth grid 102. At step 410, the first earth grid 102 and the second earth grid 104 are connected to transmit the received input current with off-grid frequency from the first earth grid 102 to the second earth grid 104 when the first inter-grid connectivity 116 is damaged using the second bypass conductor 202 and third bypass conductor 204. At step 412, voltage drop and resistance between the first reference riser 112A and the second reference riser 112B are measured using the measuring device 106. At step 414, the voltage drop and resistance obtained before and after connecting the first bypass conductor 114 between the first earth grid 102 and the second earth grid 104 is analyzed. The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the scope of the claims.

I claim:

1. A system for detecting an electrical grounding inter-grid integrity, wherein the system comprises:
    a current injection device (108) comprises;
        a frequency converter (302) that modifies an input current with grid frequency into an input current with off-grid frequency; and
        a current unit (304) that regulates the input current with off-grid frequency into a variable amplitude input current with off-grid frequency;
    an inter-grid comprises a plurality of earth grids, wherein the plurality of earth grids comprises (i) a first earth grid (102), (ii) a second earth grid (104), (iii) a third earth grid (124), and (iv) an inter grid connectivity;
    wherein the first earth grid (102) that comprises:
        a first reference riser (112A) that is connected to the current injection device (108) and the first earth grid (102), wherein the first reference riser (112A) receives the input current with off-grid frequency from the current injection device (108) and provides the input current with off-grid frequency to the first earth grid (102);
    wherein the second earth grid (104) that comprises:
        a second reference riser (112B) that is connected to the second earth grid (104) and the current injection device (108), wherein the second earth grid (104) is electrically connected to the first earth grid (102) through a first inter-grid connectivity (116) to receive the input current with off-grid frequency from the first earth grid (102), wherein the second earth grid (104) transmits the input current with off-grid frequency to the current injection device (108) using a second reference riser (112B);
    a first bypass conductor (114) that connects the first earth grid (102) and the second earth grid (104) to transmit the received input current with off-grid frequency from the first earth grid (102) to the second earth grid (104) to determine the integrity of the first inter-grid connectivity (116); and
    a measuring device (106) that is connected between the first reference riser (112A) and the second reference riser (112B) to measure a voltage drop and resistance;
    wherein the third earth grid (124) that is electrically connected to (i) the first earth grid (102) through a second inter-grid connectivity and (ii) the second earth grid (104) through a third inter-grid connectivity, wherein the third earth grid (124) is electrically connected to the first earth grid (102) and the second earth grid (104) to transmit the input current received in the first earth grid (102) to the second earth grid (104) when the first earth grid (102) and the second earth grid (104) is not connected through the first inter-grid connectivity (116),
    wherein, when in operation, the measuring device (106) measures a drop in voltage or resistance between the first earth grid (102) and the second earth grid (104) (i) before connecting the first bypass conductor (114) between the first earth grid (102) and the second earth grid (104) and (ii) after connecting the first bypass conductor (114) between the first earth grid (102) and the second earth grid (104), wherein the measuring device (106) detects a fault in a first inter grid connectivity (116) between the first earth grid (102) and the second earth grid (104) when the drop in voltage or resistance measured before connecting the first bypass conductor (114) between the first earth grid (102) and the second earth grid (104) is greater than the drop in voltage or resistance measured after connecting the first bypass conductor (114) between the first earth grid (102) and the second earth grid (104).

2. The system as claimed in claim 1, wherein the system comprises a second bypass conductor (202) that connects the first earth grid (102) and the third earth grid (124), wherein the measuring device (106) connected between the first earth grid (102) and the third earth grid (124) to detect a fault in a second inter grid connectivity (120) between the first earth grid (102) and the third earth grid (124) when a drop in voltage or resistance measured before connecting the second bypass conductor (202) between the first earth grid (102) and the third earth grid (124) is greater than a drop in voltage or resistance measured after connecting the second bypass conductor (202) between the first earth grid (102) and the third earth grid (124).

3. The system as claimed in claim 1, wherein the system comprises a third bypass conductor (204) that connects the second earth grid (104) and the third earth grid (124), wherein the measuring device (106) connected between the third earth grid (124) and the second earth grid (104) to detect a fault in a third inter grid connectivity (122) between the third earth grid (124) and the second earth grid (104) when a drop in voltage or resistance measured before connecting the third bypass conductor (204) between the third earth grid (124) and the second earth grid (104) is greater than a drop in voltage or resistance measured after connecting the third bypass conductor (204) between the third earth grid (124) and the second earth grid (104).

4. The system as claimed in claim 1, wherein the measuring device (106) connected between the first earth grid (102) and the second earth grid (104) to detect a fault in the first inter grid connectivity (116) between the first earth grid (102) and the second earth grid (104) when a drop in voltage or resistance measured before connecting the second bypass conductor (202) is greater than a drop in voltage or resistance measured after connecting the second bypass conductor (202) between the first earth grid (102) and the third earth grid (124).

5. The system as claimed in claim 1, wherein the fault comprises at least one of (i) full breakage in at least one of the first earth grid (102) or the second earth rid or the third earth grid (124) or (ii) a loose connection in at least one of the first earth grid (102) or the second earth rid or the third earth grid (124) or (iii) a good connection in at least one of the first earth grid (102) or the second earth grid (104) or the third earth grid (124).

6. A method for detecting an electrical grounding intergrid integrity, wherein the method comprises:
  modifying, using a frequency converter (302), an input current with grid frequency into an input current with off-grid frequency;
  regulating, using a current unit (304), the input current with off-grid frequency into a variable amplitude input current with off-grid frequency;
  receiving, using a first reference riser (112A), the input current with off-grid frequency from a current injection device (108) and providing the input current with off-grid frequency to a first earth grid (102), wherein the first reference riser (112A) is connected to the current injection device (108) and the first earth grid (102);
  receiving, using a first inter grid connectivity (116), the input current with off-grid 12 frequency from the first earth grid (102), wherein a second earth grid (104) that is electrically 13 connected to the first earth grid (102) through a first inter-grid connectivity (116) to receive the input current with off-grid frequency from the first earth grid (102), wherein the second earth grid (104) transmits the input current with off-grid frequency to the current injection device (108) using a second reference riser (112B);
  connecting, using a first bypass conductor (114), the first earth grid (102) and the second earth grid (104) to transmit the received input current with off-grid frequency from the first earth grid (102) to the second earth grid (104) to determine the integrity of the first inter-grid connectivity (116); and
  measuring, using a measuring device (106), a voltage drop and resistance between the first reference riser (112A) and the second reference riser (112B).

7. The method as claimed in claim 6, wherein the method comprises measuring, using the measuring device (106), a drop in voltage or resistance between the first earth grid (102) and the second earth grid (104) (i) before connecting the first bypass conductor (114) between the first earth grid (102) and the second earth grid (104) and (ii) after connecting the first bypass conductor (114) between the first earth grid (102) and the second earth grid (104).

8. The method as claimed in claim 6, wherein the method comprises detecting, using the measuring device (106), a fault in the first inter grid connectivity (116) between the first earth grid (102) and the second earth grid (104) when a drop in voltage or resistance measured before connecting the first bypass conductor (114) between the first earth grid (102) and the second earth grid (104) is greater than a drop in voltage or resistance measured after connecting the first bypass conductor (114) between the first earth grid (102) and the second earth grid (104), wherein the measuring device (106) is connected between the first earth grid (102) and a third earth grid (124).

9. The method as claimed in claim 6, wherein the method comprises detecting, using the measuring device (106), a fault in a second inter grid connectivity (120) between the first earth grid (102) and the third earth grid (124) when a drop in voltage or resistance measured before connecting a second bypass conductor (202) between the first earth grid (102) and the third earth grid (124) is greater than a drop in voltage or resistance measured after connecting the second bypass conductor (202) between the first earth grid (102) and the third earth grid (124), wherein the second bypass conductor (202) that connects the first earth grid (102) and the third earth grid (124), wherein the measuring device (106) is connected between the third earth grid (124) and the second earth grid (104).

10. The method as claimed in claim 6, wherein the method comprises detecting, using the measuring device (106), a fault in a third inter grid connectivity (122) between the third earth grid (124) and the second earth grid (104) when a drop in voltage or resistance measured before connecting a third bypass conductor (204) between the third earth grid (124) and the second earth grid (104) is greater than a drop in voltage or resistance measured after connecting the third bypass conductor (204) between the third earth grid (124) and the second earth grid (104), wherein the third bypass conductor (204) that connects the second earth grid (104) and the third earth grid (124), the measuring device (106) is connected between the first earth grid (102) and the second earth grid (104).

* * * * *